United States Patent
Nasiri et al.

(10) Patent No.: US 6,892,575 B2
(45) Date of Patent: May 17, 2005

(54) X-Y AXIS DUAL-MASS TUNING FORK GYROSCOPE WITH VERTICALLY INTEGRATED ELECTRONICS AND WAFER-SCALE HERMETIC PACKAGING

(75) Inventors: Steven S. Nasiri, Saratoga, CA (US); Joseph Seeger, Oakland, CA (US)

(73) Assignee: Invensense Inc., Saratoga, CA (US)

( * ) Notice: Subject to any disclaimer, the term of this patent is extended or adjusted under 35 U.S.C. 154(b) by 0 days.

(21) Appl. No.: 10/690,224

(22) Filed: Oct. 20, 2003

(65) Prior Publication Data

US 2005/0081633 A1 Apr. 21, 2005

(51) Int. Cl.[7] .............................. G01C 19/00; G01P 9/04
(52) U.S. Cl. .................................. 73/504.12; 7/504.04
(58) Field of Search ..................... 73/504.12, 504.04, 73/504.02, 504.13, 504.14, 504.15, 493

(56) References Cited

U.S. PATENT DOCUMENTS

| | | | | |
|---|---|---|---|---|
| 5,359,893 A | * | 11/1994 | Dunn | 73/504.12 |
| 5,895,850 A | * | 4/1999 | Buestgens | 73/504.12 |
| 5,992,233 A | | 11/1999 | Clark | 73/514.35 |
| 6,122,961 A | | 9/2000 | Geen et al. | 73/504.12 |
| 6,189,381 B1 | * | 2/2001 | Huang et al. | 73/504.12 |
| 6,250,157 B1 | * | 6/2001 | Touge | 73/504.12 |
| 6,391,673 B1 | | 5/2002 | Ha et al. | 438/51 |
| 6,480,320 B2 | | 11/2002 | Nasiri | 359/291 |
| 6,481,283 B1 | | 11/2002 | Cardarelli | 73/504.02 |
| 6,481,284 B2 | | 11/2002 | Geen et al. | 73/504.12 |
| 6,481,285 B1 | | 11/2002 | Shkel et al. | 73/504.13 |
| 6,487,908 B2 | | 12/2002 | Geen et al. | 73/504.12 |
| 6,508,122 B1 | | 1/2003 | McCall et al. | 73/504.12 |
| 6,513,380 B2 | | 2/2003 | Reeds, III et al. | 73/504.12 |
| 6,533,947 B2 | | 3/2003 | Nasiri et al. | 216/2 |
| 2003/0074967 A1 | | 4/2003 | Tang et al. | 73/504.02 |
| 2003/0110858 A1 | | 6/2003 | Kim et al. | 73/504.02 |
| 2003/0164041 A1 | | 9/2003 | Jeong et al. | 73/504.08 |

* cited by examiner

Primary Examiner—Helen Kwok
(74) Attorney, Agent, or Firm—Sawyer Law Group LLP

(57) ABSTRACT

An angular velocity sensor has two masses which are laterally disposed in an X-Y plane and indirectly connected to a frame. The two masses are linked together by a linkage such that they necessarily move in opposite directions along Z. Angular velocity of the sensor about the Y axis can be sensed by driving the two masses into Z-directed antiphase oscillation and measuring the angular oscillation amplitude thereby imparted to the frame.

In a preferred embodiment, the angular velocity sensor is fabricated from a bulk MEMS gyroscope wafer, a cap wafer and a reference wafer. In a further preferred embodiment, this assembly of wafers provides a hermetic barrier between the masses and an ambient environment.

49 Claims, 12 Drawing Sheets

X-Y AXIS DUAL-MASS TUNING FORK GYROSCOPE WITH VERTICALLY INTEGRATED ELECTRONICS AND WAFER-SCALE HERMETIC PACKAGING

FIELD OF THE INVENTION

This invention relates to angular velocity sensors, and more particularly to in-plane angular velocity sensors having two oscillating proof masses.

BACKGROUND

Sensing of angular velocity is frequently performed using an inertial sensor. Inertial angular velocity sensors broadly function by driving the sensor into a first motion and measuring a second motion of the sensor that is responsive to both the first motion and the angular velocity to be sensed.

Frequently, a mass (usually referred to as a proof mass) within the sensor is driven into oscillation by an actuator. Rotation of the sensor imparts a Coriolis force to the oscillating mass that is proportional to the angular velocity (or rotation rate), and depends on the orientation of the angular velocity vector with respect to the velocity vector of the proof mass. The Coriolis force, the angular velocity vector and the mass velocity vector are mutually orthogonal. For example, a proof mass moving in an X direction within a sensor rotating about a Y axis experiences a Z directed Coriolis force. Similarly, a proof mass moving in an X direction within a sensor rotating about a Z axis experiences a Y directed Coriolis force. Finally, a proof mass moving in an X direction within a sensor rotating about the X axis experiences no Coriolis force. Coriolis forces imparted to the proof mass are usually sensed indirectly by measuring motions within the sensor that are responsive to the Coriolis forces.

Recently, the development of micromachining technology (also known as MEMS technology) has led to the development of various MEMS angular velocity inertial sensors. MEMS technology is basically a planar technology, where suitable MEMS actuators for driving in-plane motion tend to differ significantly from suitable MEMS actuators for driving out-of-plane motion. Similarly, suitable MEMS sensors for measuring in-plane motion responsive to Coriolis forces tend to differ significantly from suitable MEMS sensors for measuring out-of-plane motion responsive to Coriolis forces. These differences are both structural differences and performance differences.

An in-plane MEMS angular velocity sensor must either drive an out-of-plane motion or sense an out-of-plane motion in order to detect an in-plane angular velocity component, due to the orthogonality of mass velocity, angular velocity and Coriolis force discussed above. In contrast, an out-of-plane MEMS angular velocity sensor can drive and sense two orthogonal in-plane motions in order to detect an out-of-plane angular velocity component. Due to the planar nature of MEMS technology, in-plane MEMS sensors and out-of-plane MEMS sensors tend to differ significantly.

Some known in-plane MEMS angular velocity sensors have two proof masses driven into oscillation. For example, U.S. Pat. No. 6,481,283 to Cardarelli teaches an in-plane MEMS sensor. In the coordinates of Cardarelli, the device plane is the YZ plane. In a first embodiment, Cardarelli teaches two masses dithered in the +/−Y direction (i.e., in-plane). Angular velocity about a Z axis leads to X directed Coriolis forces on the two masses. The two masses are attached to a gimbal rotatable about the Z axis such that X directed forces on the masses provide Z directed torques on the gimbal. The two masses are dithered to have oppositely directed velocities, so the two Coriolis forces provides a net torque on the gimbal about the Z axis. Motion of the gimbal about the Z axis is sensed.

In a second embodiment, Cardarelli teaches two masses dithered in the +/−X direction (i.e., out-of-plane). Angular velocity about a Z axis leads to Y directed Coriolis forces on the two masses. The two masses are attached to a gimbal rotatable about the Z axis such that Y directed forces on the masses provide Z directed torques on the gimbal. The two masses are dithered to have oppositely directed velocities, so the two Coriolis forces provides a net torque on the gimbal about the Z axis. Motion of the gimbal about the Z axis is sensed.

Another known in-plane MEMS angular velocity sensor having two proof masses driven into oscillation is taught in U.S. Pat. No. 6,508,122 to McCall et al. McCall et al. teach an in-plane MEMS sensor having two unconnected masses that are laterally disposed in the device plane and dithered out of phase with respect to each other in this plane direction. For definiteness, let the device plane be the XY plane, and let the dither be in the X direction. The masses oscillate in the Z direction when the sensor is rotated about the Y axis, due to Z-directed Coriolis forces. The Z directed oscillation of the masses is sensed.

The approaches of both Cardarelli and McCall et al. are motivated by a desire to reject "common mode" interference from the measurement of angular velocity. For example, an angular velocity sensor having a single proof mass can register an incorrect reading if subjected to a linear acceleration in the same direction as the Coriolis force to be sensed. With two masses, various arrangements are possible, including those mentioned above, that respond to Coriolis forces but generally do not respond to linear acceleration in the same direction as the Coriolis forces. Typically, such arrangements depend on driving the two masses so that their velocities are always equal and opposite. Any deviation from a condition of equal and opposite velocities is disadvantageous, since such deviation reduces the desired response to the Coriolis forces, and increases the undesired response to linear acceleration.

However, in practice it is not straightforward to drive two masses with equal and opposite velocities. For example, two nominally identical and identically mounted masses can differ in practice so that actuating these two masses with the same actuation provides velocities which are not equal and opposite. Actuators tend to vary in effectiveness as well, so even if two masses were identical and identically mounted, variation in the actuators connected to the two masses could again provide mass velocities which are not equal and opposite. Similarly, circuitry connected to actuators may not be identical, etc. As a result, known two mass in-plane angular velocity sensors have not fully realized the common mode rejection promised by two mass configurations.

OBJECTS AND ADVANTAGES

Accordingly, it is an object of the invention to provide an in-plane angular velocity sensor having improved measurement accuracy due to mechanically constraining the two masses to move in opposite directions, thereby improving common mode rejection.

Another object of the invention is to provide an angular velocity sensor having reduced cost due to vertical integration of sense and drive electronics.

A further object of the invention is to provide an angular velocity sensor having low cost hermetic packaging.

Yet another object of the invention is to provide an angular velocity sensor having improved performance due to the use of bulk MEMS technology providing larger proof masses having increased travel distance.

Another object of the invention is to provide an angular velocity sensor having improved performance and reduced cost by use of torsionally mounted and electrostatically driven plates having lever arms attached to the masses, to increase mass travel distance.

A further object of the invention is to provide a low cost dual axis in-plane gyroscope module having an X axis angular velocity sensor and a Y axis angular velocity sensor integrated onto the same device die.

SUMMARY

The present invention provides an in-plane angular velocity sensor having two masses that are laterally disposed in the plane and indirectly connected to a frame. The two masses are linked together by a linkage such that they move in opposite directions along Z (i.e., when one mass moves in the +Z direction, the other mass moves in the −Z direction, and vice versa). Here Z is the out-of-plane direction. In-plane angular velocity can be sensed by driving the two masses into Z-directed antiphase oscillation and measuring the angular oscillation amplitude thereby imparted to the frame. Alternatively, in-plane angular velocity can be sensed by driving the frame into angular oscillation about the Z axis and measuring the Z-directed antiphase oscillation amplitude thereby imparted to the two masses.

In a preferred embodiment, the frame, the two masses and the linkage are fabricated from a single Silicon wafer using bulk micromachining (MEMS) technology to form a gyroscope wafer. In a further preferred embodiment, circuitry for driving and sensing motion of elements of the gyroscope wafer is included in a single Silicon wafer to form a reference wafer that is affixed to the gyroscope wafer. In this embodiment, it is also preferred to fabricate a cap wafer from a single Silicon wafer, and affix the cap wafer to the gyroscope wafer such that the gyroscope wafer is sandwiched in between the cap wafer and the reference wafer. In this manner, a hermetic barrier can be formed to protect the elements of the gyroscope wafer from an environment.

DETAILED DESCRIPTION OF THE DRAWINGS

Figure 1:
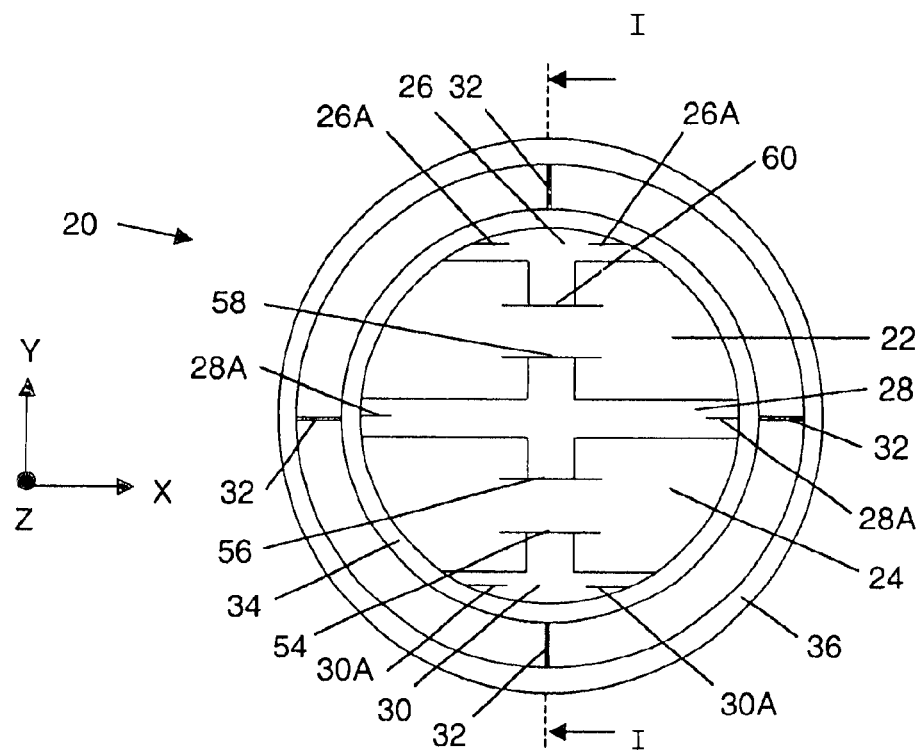
FIG. 1 schematically shows a plan view of a gyroscope wafer according to the present invention.

FIG. 1 schematically shows a plan view of a gyroscope wafer 20 according to a preferred embodiment of the invention. In the embodiment of FIG. 1, the various elements indicated on the Figure are preferably fabricated from a single Silicon wafer. The mechanical configuration of gyroscope wafer 20 will be considered first, followed by its operation. Finally the fabrication of gyroscope wafer 20 will be discussed.

Mechanical Configuration

In the embodiment of FIG. 1, a center plate 28 is attached to a frame 34 by torsional hinges 28A, which permit center plate 28 to rotate about the X axis on FIG. 1. Hinges 28A may also provide a restoring torque on plate 28 that tends to restore its position to a nominal position in the X-Y plane. A proof mass 22 is attached to center plate 28 by a hinge 58, and a proof mass 24 is attached to center plate 28 by a hinge 56. The subassembly of center plate 28, proof mass 22 and proof mass 24 together make up a linkage, such that proof masses 22 and 24 necessarily move in opposite directions along the Z axis.

It is preferred to incorporate additional elements into the linkage as follows: a first edge plate 26 is attached to proof mass 22 by a hinge 60 and is attached to frame 34 by torsional hinges 26A; and a second edge plate 30 is attached to proof mass 24 by a hinge 54 and is attached to frame 34 by torsional hinges 30A. Torsional hinges 26A and 30A permit plates 26 and 30, respectively, to rotate about the X axis on FIG. 1, and may also provide restoring torques to plates 26 and 30, respectively, which tend to restore the positions of plates 26 and 30 to their nominal positions in the X-Y plane.

Frame 34 is attached to a base 36 with a plurality of flexures 32. Flexures 32 are arranged to provide a restoring torque to frame 34 when it is rotated about the Z axis to a position which differs from its nominal position. FIG. 1 shows four flexures 32, symmetrically disposed about the perimeter of frame 34. Although a symmetrical flexure configuration providing good mechanical support for frame 34, such as the configuration of FIG. 1, is preferred, the invention does not require such a flexure configuration.

Rotation of frame 34 with respect to base 36 can be sensed with capacitive sensors disposed in between and connected to frame 34 and base 36. Alternatively, frame 34 can be driven into angular oscillation about the Z axis using electrostatic actuators disposed in between and connected to frame 34 and base 36. Various configurations are known in the art for such capacitive sensors and electrostatic actuators, and in many cases a particular electrode configuration can provide either function.

Figure 5:
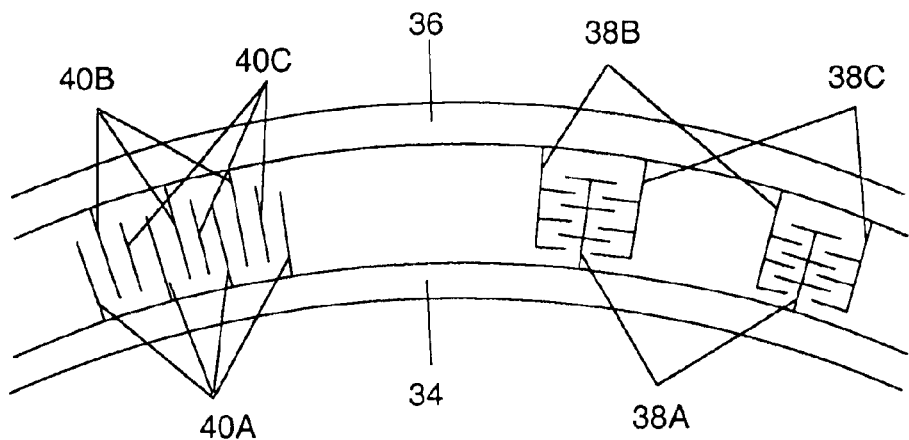
FIG. 5 schematically shows two electrode configurations suitable for use with the present invention.

Two exemplary electrode configurations suitable for sensing and/or driving relative angular motion of frame 34 with respect to base 36 are schematically illustrated on FIG. 5 as 38A, 38B, and 38C and 40A, 40B, and 40C. These, or similar, electrode configurations are preferably disposed symmetrically around the perimeter of frame 34. Practice of the invention does not require any particular electrode configuration.

The elements within frame 34 on FIG. 1 (i.e., the preferred linkage including masses 22 and 24, and plates 26, 28, and 30) are attached to frame 34 only by hinges 26A, 28A and 30A. There is a gap in between frame 34 and masses 22 and 24. Other than at attachment points for these hinges, there is also a gap in between frame 34 and plates 26, 28, and 30. These gaps are large enough to permit the linkage to move through its design range without colliding with frame 34. These gaps are not shown on FIG. 1.

Figure 2:
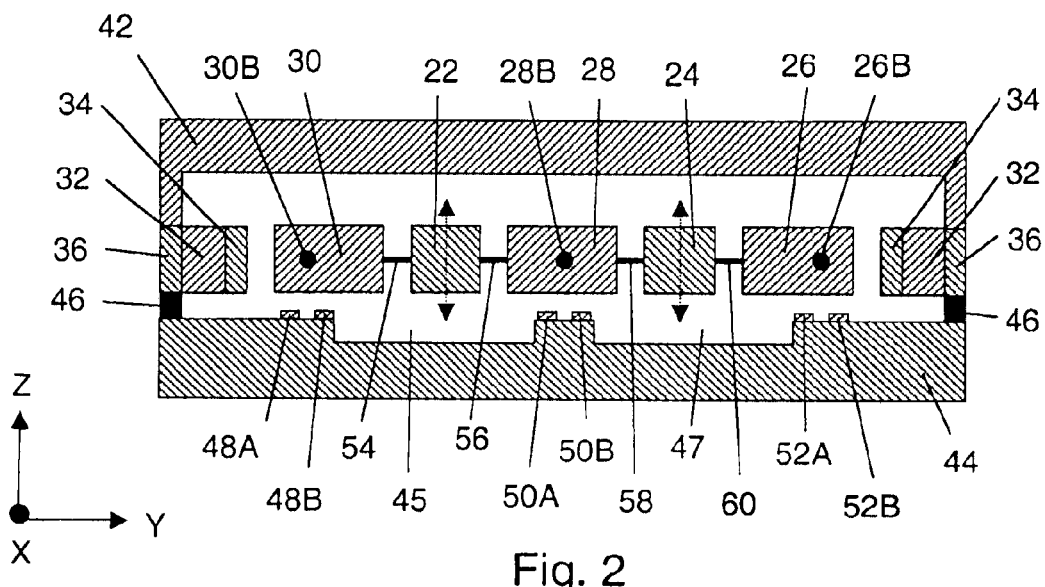
FIG. 2 schematically shows a cross section view of an embodiment of the invention, including a cross section view of the gyroscope wafer of FIG. 1 along line I.

FIG. 2 schematically shows a cross section view of an embodiment of the invention. This cross section view includes a cross section view of gyroscope wafer 20 of FIG. 1 along line I. Gyroscope wafer 20 of FIG. 1 is preferably affixed to a cap wafer 42 and to a reference wafer 44 such that gyroscope wafer 20 is sandwiched in between cap wafer 42 and reference wafer 44 as shown on FIG. 2. With this configuration, cap wafer 42 and reference wafer 44 combine to protect gyroscope wafer 20 from an ambient environment, thereby increasing the reliability and ruggedness of the sensor. Furthermore, the bonds in between gyroscope wafer 20 and wafers 42 and 44 can be made so as to provide a hermetic barrier in between critical elements of gyroscope wafer 20, such as the moving masses 22 and 24, and the ambient environment.

Figure 11A:
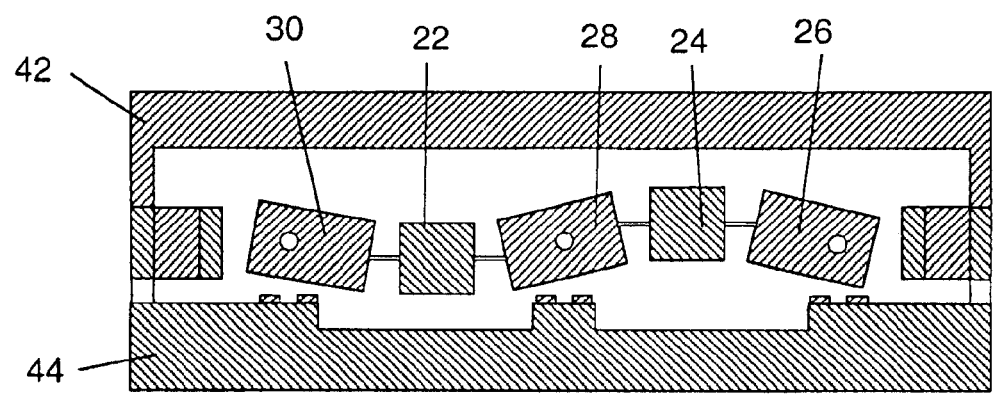
FIGS. 11a and 11b schematically show how the configuration of FIG. 2 moves in operation.
Figure 11B:
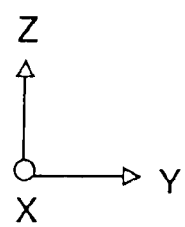
Figure 11B:
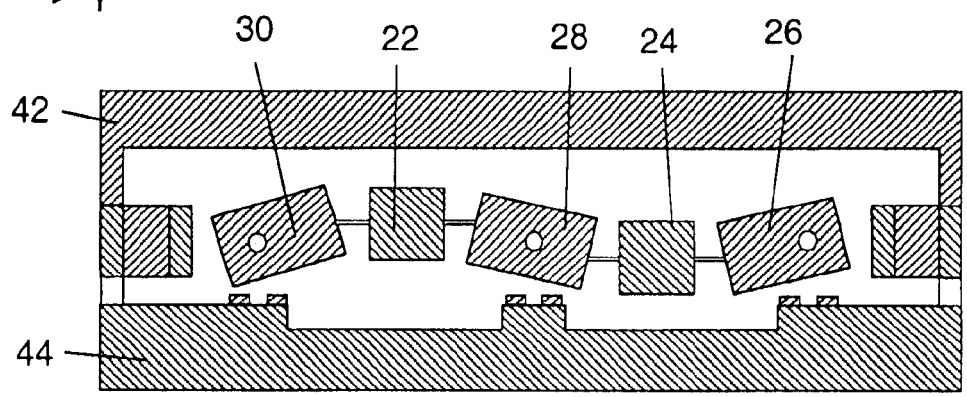

The motion of the linkage including masses 22 and 24, as well as plates 26, 28, and 30, is best appreciated in connection with FIGS. 2, 11a and 11b. Points 26B, 28B and 30B on FIG. 2 are aligned with torsional hinges 26A, 28A and 30A respectively, so plates 26, 28 and 30 can rotate in the plane of FIG. 2 (the Y-Z plane) about points 26B, 28B and 30B respectively. The components of this linkage are connected together by flexure hinges 54, 56, 58, and 60, which inhibit relative translation of adjacent components, but allow relative rotation of adjacent components in the Y-Z plane.

Accordingly, when mass 22 moves in the +Z direction on FIG. 2 (i.e., up on FIG. 2), plate 28 rotates clockwise about point 28B and mass 24 must move in the -Z direction, while plates 26 and 30 rotate counterclockwise, as shown on FIG. 11b. Likewise, when mass 22 moves in the -Z direction, plate 28 rotates counterclockwise, and mass 24 moves in the +Z direction, while plates 26 and 30 rotate clockwise, as shown on FIG. 11a. In other words, the linkage formed by mass 22, mass 24 and plates 26, 28, and 30 ensures that masses 22 and 24 necessarily move in opposite directions along the Z axis. As discussed above, there are gaps in between frame 34 and plate 26 and in between frame 34 and plate 30, which are apparent on FIG. 2.

Cap wafer 42 and reference wafer 44 are attached to base 36 of gyroscope wafer 20, and do not make contact with any other component of gyroscope wafer 20, as shown on FIG. 2. Since flexures 32 and frame 34 make no contact with cap wafer 42, or with reference wafer 44, these wafers do not interfere with rotation of frame 34 about the Z axis. The connection between reference wafer 44 and base 36 is schematically indicated as 46 on FIG. 2. Connection 46 is both a mechanical connection between reference wafer 44 and base 36 and an electrical connection between reference wafer 44 and base 36. In this manner, circuitry on reference wafer 44 is connected to sense/drive means on gyroscope wafer 20, such as electrodes 38A, 38B, 38C or electrodes 40A, 40B, 40C on FIG. 5.

Electrodes 48A and 48B are positioned on reference wafer 44 beneath plate 30. Electrodes 48A and 48B are positioned on either side of the rotation axis of plate 30, indicated as point 30B on FIG. 2. Similarly, electrodes 50A and 50B are positioned beneath plate 28, and electrodes 52A and 52B are positioned beneath plate 26.

Figure 3:
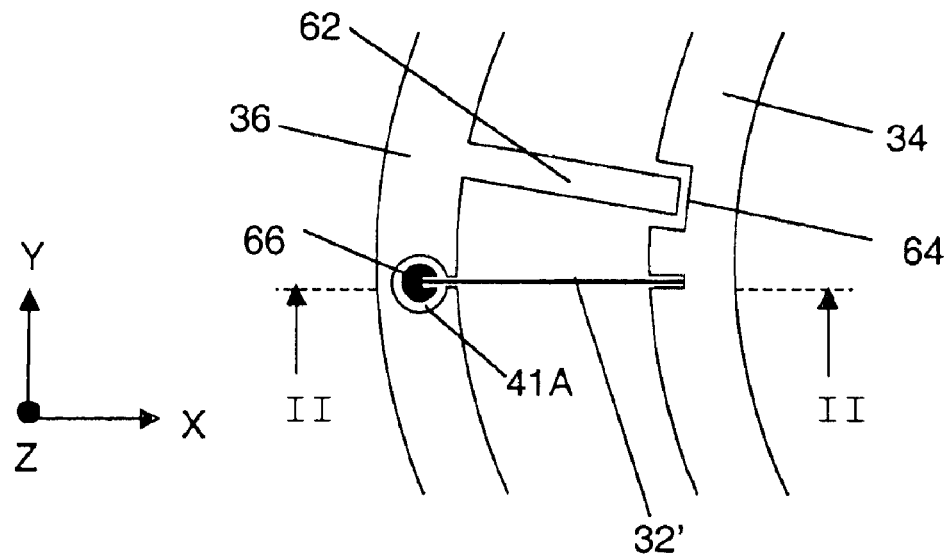
FIG. 3 schematically shows a plan view showing details of a preferred flexure configuration.

FIG. 3 schematically shows a more detailed plan view of a preferred configuration for flexure 32 on FIG. 1. In the configuration of FIG. 3, flexure 32 comprises a spring 32' and a base flexure mount 66. As indicated on FIG. 3, the attachment point of spring 32' to mount 66 is recessed into mount 66, and similarly for frame 34, to reduce the coupling of surface stresses from mount 66 to spring 32' and from frame 34 to spring 32'.

Base flexure mount 66 is surrounded by a base isolation trench 41A, which serves to mechanically isolate flexure 32 from stresses within base 36. Such stresses can be transmitted to base 36 by cap wafer 42 and reference wafer 44 as a result of packaging and/or bonding processes, thermal expansion, etc. A base tab 62 is also shown on FIG. 3, which is engaged with a frame groove 64. Frame groove 64 is somewhat larger than the width of base tab 62, as schematically indicated on FIG. 3, so that frame 34 can rotate only within a certain selected range relative to base 36 before base tab 62 collides with a wall of frame groove 64. This selected range is chosen to ensure that flexure 32 is not damaged by motion within the selected range. In this manner, the combination of tab 62 and groove 64 provides protection for flexure 32.

Figure 4:
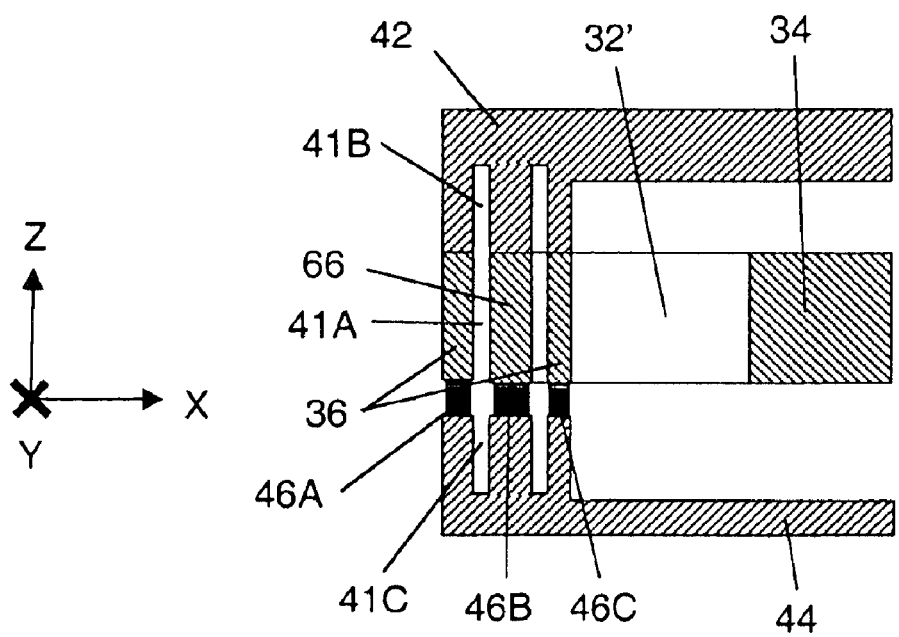
FIG. 4 schematically shows a cross section view of the flexure configuration of FIG. 3 along line II.

Further details of a preferred configuration for flexure 32 are shown in the cross section view of FIG. 4, which includes a cross section view of FIG. 3 along line II. Line II is immediately adjacent to spring 32', but does not cut through it, which is why spring 32' is not shown as a cross section on FIG. 4. Base flexure mount 66 is affixed to cap wafer 42 and is connected to reference wafer 44 via a connection 46B. In this manner, flexure 32 is connected to cap wafer 42 and reference wafer 44, and isolation from base 36. This is advantageous because cap wafer 42 and reference wafer 44 are typically much thicker than base 36 (a typical thickness for gyroscope wafer 20 is only 50 microns), and therefore provide much greater mechanical rigidity for anchoring flexure 32. Also shown on FIG. 4 is a reference isolation trench 41C, and a cap isolation trench 41B. Reference isolation trench 41C serves to isolate flexure 32 from stresses which may be present in the top surface of reference wafer 44 (i.e., the surface of reference wafer 44 that is bonded to base 36). Similarly, cap isolation trench 41B serves to isolate flexure 32 from stresses which may be present in the bottom surface of cap wafer 42 (i.e., the surface of cap wafer 42 that is bonded to base 36). Although the flexure configuration of FIGS. 3 and 4, where flexure 32 comprises spring 32' and base mount 66 is preferred, it is not necessary to practice the invention.

Figure 6:
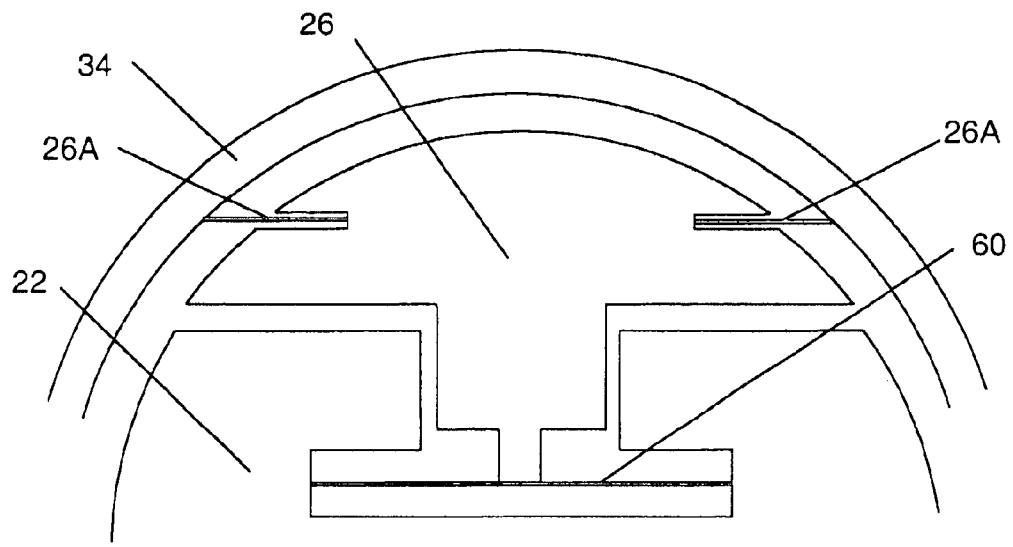
FIG. 6 schematically shows an enlarged view of a portion of the gyroscope wafer of FIG. 1.
Figure 7A:
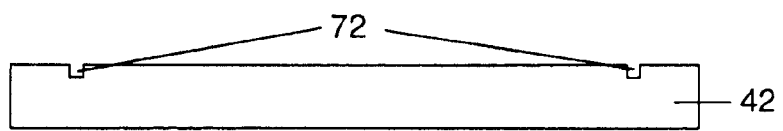
FIGS. 7a, 7b, 7c, and 7d schematically show processing steps for making a cap wafer according to an embodiment of the invention.
Figure 7B:
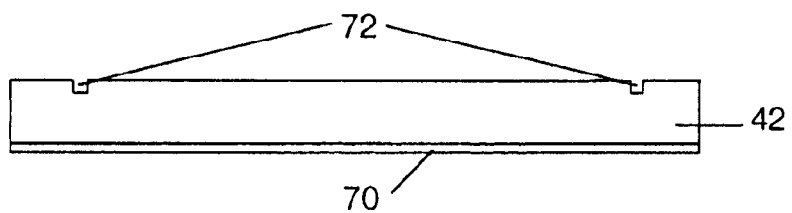
Figure 7C:
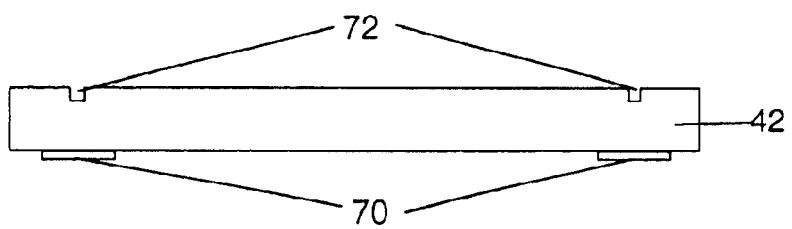
Figure 7D:
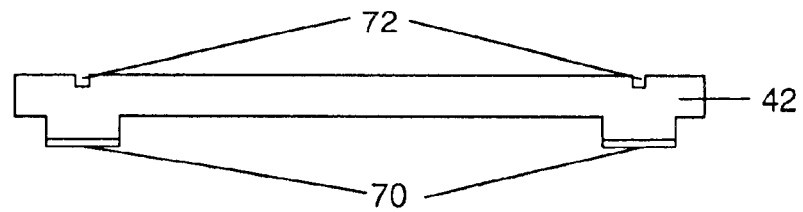

FIG. 6 schematically shows an enlarged plan view of a portion of gyroscope wafer 20, which shows a preferred configuration of torsional hinges 26A and flexure hinge 60 in greater detail. As shown on FIG. 6, plate 26 is attached to frame 34 by torsional hinges 26A. The configuration of torsional hinges 26A is such that plate 26 can rotate about the axis connecting the centers of torsional hinges 26A. As shown on FIG. 6, slots are formed in plate 26 to increase the length of torsional hinges 26A. This is done in order to reduce the strain required on torsional hinges 26A to accommodate a given rotation of plate 26.

Plate 26 is connected to mass 22 with flexure hinge 60. The configuration of flexure hinge 60 is such that plate 22 can tilt relative to mass 26 (and vice versa). As shown on FIG. 6, a slot is formed in mass 22 to increase the length of flexure hinge 60, in order to reduce the strain required on flexure hinge 60 to accommodate a given tilt of mass 22 with respect to plate 26.

The configurations of flexure hinges 58, 56, and 54 are preferably similar to the configuration shown on FIG. 6 for flexure hinge 60. Likewise, the configurations of torsional hinges 28A and 30A are preferably similar to the configuration shown on FIG. 6 for torsional hinge 26A. The hinge configurations shown in FIG. 6 pertain to a preferred embodiment of the invention. Practice of the invention does not require any particular hinge configuration.

Operation

The embodiment of FIGS. 1 and 2 has two modes of operation. In a first and preferred mode of operation, masses 22 and 24 are driven into oscillation and the motion of frame 34 is sensed to measure Y-directed angular velocity. In a second mode of operation, frame 34 is driven into oscillation and the motion of masses 22 and 24 is sensed to measure Y-directed angular velocity. These two methods will be considered in turn.

The first preferred mode of operation includes an actuator for driving the linkage into oscillation. In the embodiment of FIGS. 1 and 2, an electrostatic actuator is provided by electrodes 48A, 48B, 50A, 50B, 52A and 52B of FIG. 2. Electrodes 48A, 48B, 50A, 50B, 52A and 52B interact with plates 30, 28 and 26 via an electrostatic interaction, where the force increases as the potential difference between the electrode and the corresponding plate increases. Plates 26, 28 and 30 are typically held at the same electric potential, which can be taken to be the zero reference for electric potential without loss of generality.

Electrodes 48A, 48B, 50A, 50B, 52A and 52B are preferably split electrodes, as shown on FIG. 2. The main reason for this is that the electrostatic interaction between a plate and an electrode tends to be an attraction (instead of a repulsion), so to provide torques in either direction, an electrode element on either side of the rotation axis is required, as shown on FIG. 2. The gap between electrodes 48A, 48B, 50A, 50B, 52A and 52B, and the corresponding plates (30, 28 and 26 respectively) is preferably precisely controlled in fabrication to a gap height d, to reduce the voltage required to obtain a given rotation of the plates as much as possible, while still providing adequate clearance for the movement of actuators. Electrodes 48A, 48B, 50A, 50B, 52A and 52B are preferably electrically driven in a cooperative manner to excite an oscillation mode of the linkage formed by masses 22 and 24, and plates 26, 28, and 30 having oscillation of masses 22 and 24, substantially cut of phase with each other, in the Z direction (i.e., out of plane direction). The linkage motion corresponding to this oscillation mode is schematically shown on FIGS. 11a and 11b.

It is also preferable for plate 26 to include a lever arm extending toward mass 22, for plate 30 to include a lever arm extending toward mass 24, and for plate 28 to include lever arms extending toward both mass 22 and mass 24, all as shown on FIG. 1. As a result of the lever arms extending from plates 26, 28 and 30, the distance between the flexure hinges (54, 56, 58, 60) and the axes of plate rotation (26B, 28B, 30B) is increased, which increases the displacement of masses 22 and 24 provided by a given rotation of the plates. Such increased displacement is highly desirable for improving gyroscope performance and/or for providing a desired level of performance at a lower cost. To accommodate the increased travel of masses 22 and 24, recesses 45 and 47 are formed in reference wafer 44 beneath masses 22 and 24, respectively. Cap wafer 42 is also configured to allow sufficient room to accommodate all moving parts of gyroscope wafer 20.

When gyroscope wafer 20 is rotated about the Y axis with angular velocity $\omega_y$, masses 22 and 24 experience oscillating X-directed Coriolis forces in the reference frame of gyroscope wafer 20. The Coriolis forces on masses 22 and 24 are oppositely directed along the X axis, since the two masses are moving in opposite directions along the Z axis. The Coriolis forces on masses 22 and 24 induce an oscillatory torque on frame 34 about the Z axis, which sets frame 34 into angular oscillation. Since the amplitude of the angular oscillation of frame 34 depends on $\omega_y$ (ideally it is proportional to $\omega_y$), measuring this amplitude provides a measurement of the angular velocity $\omega_y$.

In order to improve gyroscope sensitivity, it is preferable to exploit mechanical resonances of the gyroscope structure. Accordingly, it is preferable to drive the linkage containing masses 22 and 24 at a frequency which is equal or about equal to the fundamental linkage resonant mode frequency. Preferably, the fundamental linkage resonant mode (i.e., the mechanical mode having lowest frequency) will correspond to antiphase oscillation of masses 22 and 24 as shown in FIGS. 11a and 11b. Such correspondence can be ensured during design of the linkage and its supporting flexures. By selecting a driving frequency at or near the linkage natural frequency, the motion of the linkage provided by a given actuator force is increased.

It is also preferable to ensure that the fundamental frame resonant mode corresponds to rigid body angular oscillation of frame 34 about the Z axis, which can be done by suitable design of frame 34 and flexures 32. Furthermore, it is preferable for the frame fundamental frequency to be greater than the linkage fundamental frequency. This ensures that the drive frequency is closer in frequency to the fundamental mode of frame 34 than to any other resonant mode of frame 34, thereby minimizing the excitation of higher order mechanical modes of frame 34 which can interfere with gyroscope operation.

In this embodiment, the angular oscillation amplitude of frame 34 is sensed with a transducer. Preferably, the transducer is a capacitive sensor disposed between and connected to frame 34 and base 36. Two suitable electrode configurations for such a capacitive sensor are shown on FIG. 5. The configuration shown as 38A, 38B and 38C on FIG. 5 is referred to as a tree configuration, while the configuration shown as 40A, 40B and 40C on FIG. 5 is referred to as a radial configuration.

In the tree configuration, electrodes 38A are attached to and move with frame 34, while electrodes 38B and 38C are both attached to base 36 and do not move with frame 34. The "unit cell" consisting of one electrode 38A, one electrode 38B and one electrode 38C can be repeated as desired in the region between frame 34 and base 36. Two such "unit cells" are shown on FIG. 5. Electrically, all electrodes 38A are connected to each other, all electrodes 38B are connected to each other, and all electrodes 38C are connected to each other. Thus two capacitors are formed: capacitor AB between electrodes 38A and 38B, and capacitor AC between electrodes 38A and 38C. Such an arrangement, where electrodes 38B are not connected to electrodes 38C, is known as a split-finger configuration. Since motion of frame 34 changes the capacitance of capacitors AB and AC, measuring these capacitances with circuitry provides sensing of motion of frame 34. Such circuitry is preferably located on reference wafer 44.

Similarly, in the radial configuration, electrodes 40A are attached to and move with frame 34, while electrodes 40B and 40C are attached to base 36 and do not move with frame 34. Again, two capacitors are formed, and measuring these capacitances with circuitry (preferably located on reference wafer 44) provides sensing of motion of frame 34.

In a second mode of operation, frame 34 is driven into angular oscillation about the Z axis, which entails antiphase oscillation of masses 22 and 24 along the X axis. When gyroscope wafer 20 is rotated about the Y axis with angular velocity $\omega_y$, the oscillation of frame 34 induces oscillating Z-directed Coriolis forces on masses 22 and 24, which set the linkage including masses 22 and 24 into oscillation. Since the amplitude of the oscillation of the linkage depends on $\omega_y$, (ideally it is proportional to $\omega_y$, measuring this amplitude provides a measurement of the angular velocity $\omega_y$.

Since this second mode of operation is similar to the first preferred mode of operation, the above discussion is applicable with the following differences: 1) The second operation mode includes an actuator for driving frame 34 into angular oscillation. An electrostatic actuator connected to frame 34 and base 36 is one suitable means for driving frame 34 into angular oscillation. Such an electrostatic actuator may have various electrode configurations, including the configurations of FIG. 5.

2) In the second operation mode, it is preferable to drive the frame at or near its fundamental resonance frequency, and it is preferable for the linkage fundamental frequency to be greater than the frame fundamental frequency.

3) The second operation mode includes a transducer for sensing oscillation of the linkage. A capacitive sensor connected to the linkage is a suitable transducer. Electrodes 48A, 48B, 50A, 50B, 52A and 52B on FIG. 2 provide such a capacitive sensor. Motion of plate 26 above electrodes 52A and 52B is sensed by measuring capacitance between electrode 52A and plate 26, and measuring capacitance between electrode 52B and plate 26. Motion of plates 28 and 30 is sensed similarly.

In both modes of operation, angular velocity sensors according to an embodiment of the invention advantageously reduce errors induced by any linear acceleration the sensor may be subjected to. In the first operation mode, the motion that is sensed is an angular oscillation of frame 34, and linear acceleration of the sensor does not tend to induce such a motion. In the second operation mode, the motion that is sensed is an antiphase oscillation of masses 22 and 24, and here also the sensed motion is not a motion that linear acceleration tends to induce. For example, linear Z directed acceleration tends to induce in-phase (as opposed to antiphase) oscillation of masses 22 and 24.

Fabrication

In a preferred embodiment, an angular rotation sensor (or gyroscope) having the structure and operation discussed above is fabricated with micromachining technology (also known as MEMS technology). Two forms of MEMS technology are known: bulk MEMS and surface MEMS. Bulk MEMS technology is preferable for the present invention, because bulk MEMS proof masses (i.e. masses 22 and 24) can have greater mass and can have a larger range of motion than surface MEMS proof masses. FIGS. 7a–d, 8a–d, 9a–d and 10a, b schematically show an exemplary fabrication sequence suitable for fabricating an embodiment of the invention.

FIGS. 7a–d schematically show a sequence of steps suitable for fabricating cap wafer 42. On FIG. 7a, cap wafer 42 is patterned with backside alignment marks 72. Marks 72 can be made using reactive ion etching (RIE). In passing from FIG. 7a to FIG. 7b, the surface of cap wafer 42 facing away from alignment marks 72 is cleaned, and then thermally oxidized, to generate an oxide layer 70. Oxide layer 70 is preferably about 0.5 microns thick, and can be made by heating wafer 42' to a high temperature (e.g., greater than 1000 C) in a water-containing ambient environment. In passing from FIG. 7b to FIG. 7c, oxide layer 70 is lithographically patterned, as schematically shown on FIG. 7c. In passing from FIG. 7c to 7d, material of cap wafer 42 not protected by oxide layer 70 is etched away to a depth of about 100 microns. Deep RIE (DRIE) is a suitable etch method for this step. At this point in the process, cap wafer 42 has the configuration shown in FIG. 2. After the etch, cap wafer 42 is cleaned in preparation for a fusion bond. Suitable cleaning steps include a high temperature (>300 C) ashing step and a sulfuric peroxide dip. The cleaning methods employed must leave patterned oxide layer 70 intact.

Figure 8A:
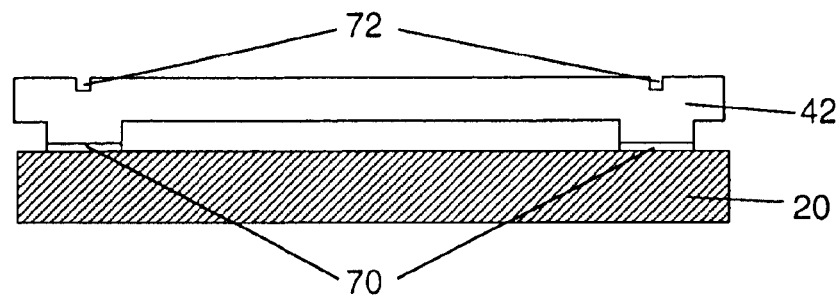
FIGS. 8a, 8b, 8c, and 8d schematically show processing steps for making an assembly of a cap wafer and a gyroscope wafer according to an embodiment of the invention.
Figure 8B:
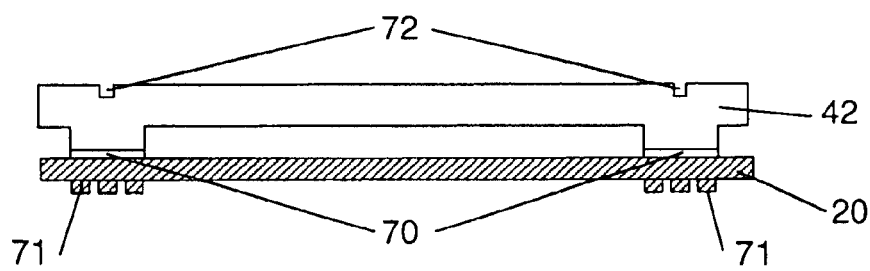

FIGS. 8a–d schematically show a sequence of processing steps suitable for fabricating gyroscope wafer 20. Gyroscope wafer 20 is preferably a prime low total thickness variation (TTV) wafer. Gyroscope wafer 20 is cleaned with a sulfuric peroxide dip and is then fusion bonded to patterned oxide layer 70 on cap wafer 42, as shown on FIG. 8a. In the processing sequence of FIGS. 7–10, the bonding of cap wafer 42 to gyroscope wafer 20 occurs in an earlier stage of processing than the bonding of reference wafer 44 to gyroscope wafer 20. Accordingly, relatively high temperature bonding processes are preferred for bonding cap wafer 42 to gyroscope wafer 20, including but not limited to: eutectic metal bonding, glass bonding, solder bonding, Gold eutectic bonding, Si to $SiO_2$ fusion bonding and Si to Si fusion bonding. In passing from FIG. 8a to FIG. 8b, gyroscope wafer 20 is thinned from typically about 500 microns thickness to about 40 microns thickness. Conventional grinding and polishing is a suitable method for performing this thinning step. The thinning of gyroscope wafer 20 can be done uniformly, or it can be done so that regions of gyroscope wafer 20 that will become masses 22 and 24 are thicker than other parts of gyroscope wafer 20. Such increased thickness is beneficial because it increases the masses of masses 22 and 24. After gyroscope wafer 20 is thinned, standoffs 71 shown on FIG. 8b are formed by lithographic patterning followed by an etch. A KOH etch is suitable for this step. The purpose of standoffs 71 is to precisely determine the vertical separation d between actuator electrodes such as electrodes 48A, B, 50A, B and 52A, B on FIG. 2 from the corresponding plates (i.e., plates 30, 28 and 26 respectively).

Figure 8C:
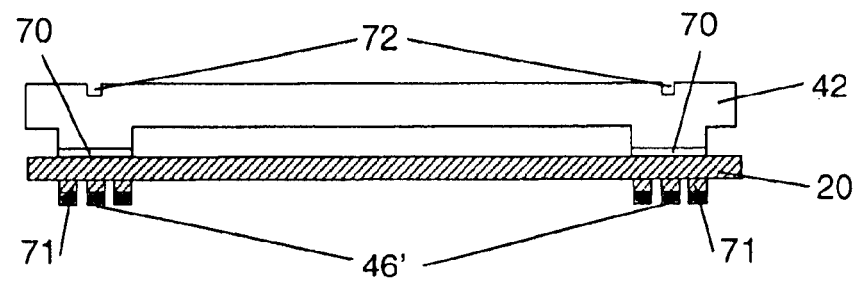

In passing from FIG. 8b to FIG. 8c, a patterned layer 46' is deposited on gyroscope wafer 20. Preferably, patterned layer 46' is a Ge layer which is deposited and then patterned (e.g., by lithography followed by an etch). Preferably, patterned layer 46' also defines electrodes between frame 34 and base 36, which can be of the types shown in FIG. 5. Alternatively, electrodes between frame 34 and base 36 can be formed in a separate processing step from deposition of patterned layer 46'.

Figure 8D:
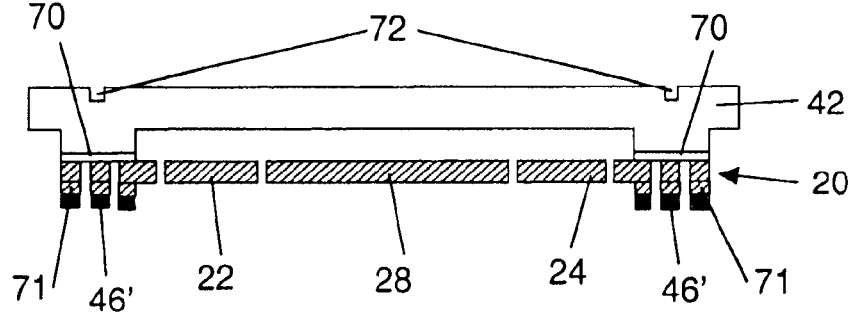

In passing from FIG. 8c to FIG. 8d, the mechanical elements of gyroscope wafer 20 are formed by etching through gyroscope wafer 20. The pattern to be etched can be formed photolithographically. A 2 micron line width and 2 micron spacing is suitable for this etch, which stops on oxide layer 70. Deep RIE with Silicon-on-insulator (SOI) antifooting enhancement is a suitable etch method for this step. It is preferable for this etching to be performed with an etching process suitable for creating high-aspect ratio features. After the etch of FIG. 8d has been performed, all of the mechanical elements of gyroscope wafer 20, shown on FIGS. 1–4 and FIG. 6, are formed. These elements include masses 22 and 24, plates 26, 28, and 30, flexures 32, frame 34, and hinges 26A, 28A, 30A, 54, 56, 58 and 60. For simplicity, FIG. 8d only shows plate 28 and masses 22 and 24.

Figure 9A:
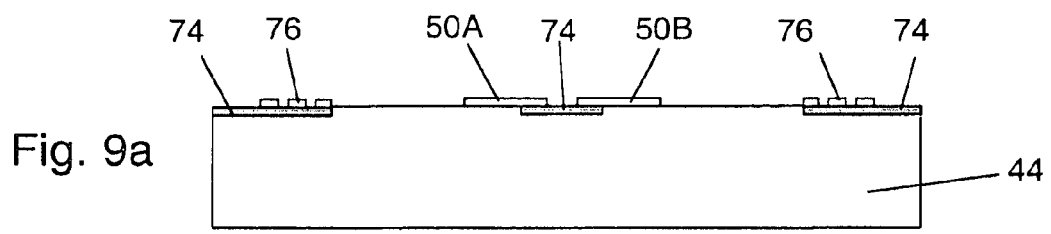
FIG. 9a, and 9b schematically show processing steps for making a reference wafer according to an embodiment of the invention.
Figure 9B:
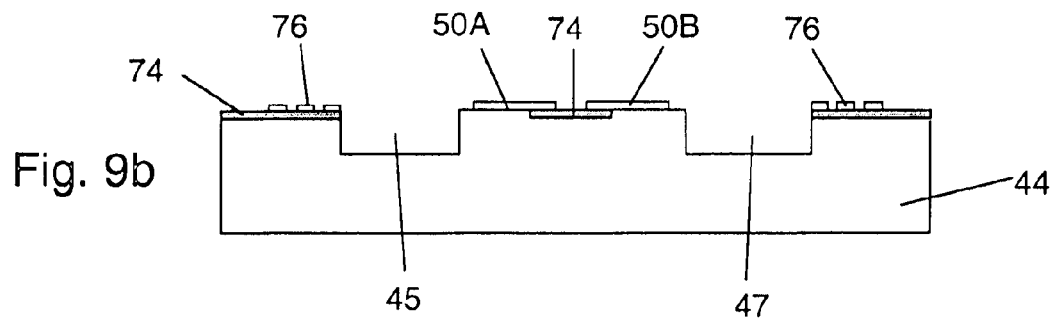

FIGS. 9a–b schematically show a sequence of processing steps suitable for fabricating reference wafer 44. On FIG. 9a, the active areas of reference wafer 44 are schematically indicated as 74. Active areas 74 include regions that will make electrical contact with gyroscope wafer 20, as well as circuitry for driving gyroscope wafer 20 and circuitry for sensing output signals provided by gyroscope wafer 20. Such circuitry is preferably conventional Silicon CMOS circuitry. In the preferred embodiment, the last layer of metal deposited in the conventional CMOS process is a metal layer suitable for use as a bond metal. This upper layer of metal also defines the electrodes 48A, B, 50A, B and 52A, B (only electrodes 50A, B are shown on FIG. 9b), and bond pads 76, schematically shown on FIG. 9a. In passing from FIG. 9a to FIG. 9b, recesses 45 and 47 are formed in reference wafer 44. Recesses 45 and 47 are preferably fabricated with DRIE, to a depth of about 100 microns.

Figure 10A:
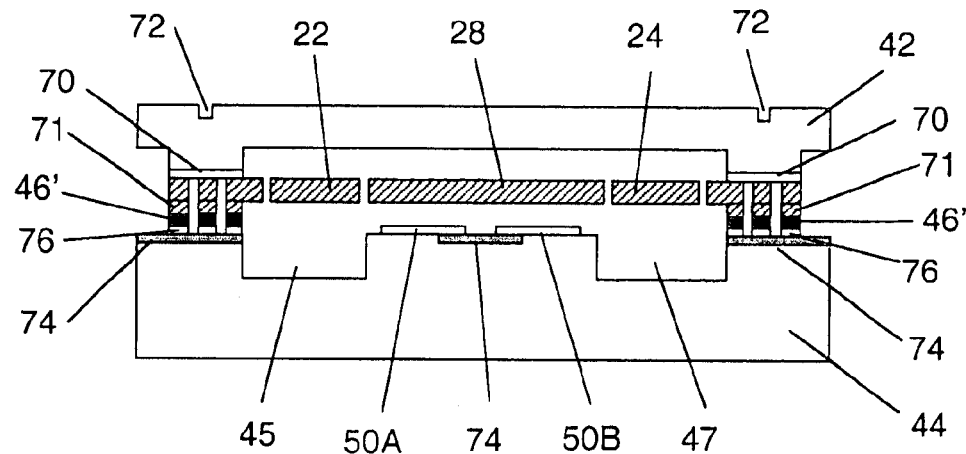
FIGS. 10a and 10b schematically show processing steps for making an assembly of cap wafer, gyroscope wafer and reference wafer according to an embodiment of the invention.
Figure 10B:
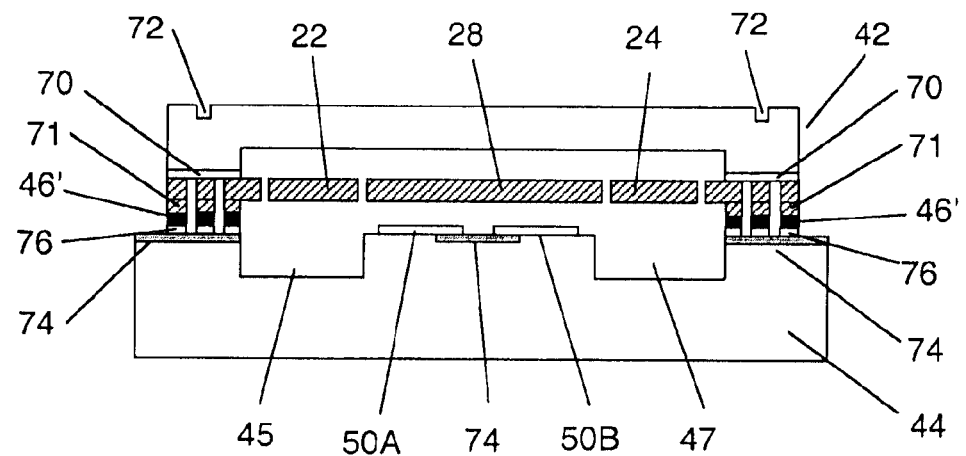

FIGS. 10a–b schematically show a sequence of processing steps suitable for final assembly of gyroscope wafer 20, reference wafer 44 and cap wafer 42. On FIG. 10a, reference wafer 44 is shown attached to gyroscope wafer 20 via an aligned metal to metal bond between patterned layer 46' on gyroscope wafer 20, and bond pads 76 on reference wafer 44. In the processing sequence of FIGS. 7–10, the bonding of reference wafer 44 to gyroscope wafer 20 occurs in a later stage of processing than the bonding of cap wafer 42 to gyroscope wafer 20. Accordingly, relatively low temperature bonding processes are preferred for bonding reference wafer 44 to gyroscope wafer 20, including but not limited to: eutectic metal bonding, Aluminum-Germanium bonding, solder bonding, Indium-Gold bonding, and polymer bonding.

The separation d between plate 28 and electrodes 50A and 50B on FIG. 10a is determined by the combined thickness of standoffs 71 and patterned layer 46', and can be precisely controlled (or predetermined) by selecting the height of standoffs 71. The separation between other electrodes (e.g., electrodes 48A, B and electrodes 52A, B) and their corresponding plates (e.g., plates 30 and 26 respectively) is also determined in the same way, and typically the same predetermined distance d separates all plates from their corresponding electrodes. Although the processing sequence of FIGS. 7–10 shows standoffs 71 being formed exclusively on gyroscope wafer 20, it is also possible to form standoffs exclusively on reference wafer 44, or on both gyroscope wafer 20 and reference wafer 44 in order to define the separation between plates and electrodes. In passing from FIG. 10a to FIG. 10b, material is etched away from cap wafer 42 to allow access to active areas 74 from above. This etch can be done with DRIE. By allowing access to active areas 74 from above, electrical connection to the angular velocity sensor of FIG. 10b is facilitated.

Reference wafer 44 is preferably attached to gyroscope wafer 20 via a metal-to-metal bond, which can be made hermetic. Likewise, gyroscope wafer 20 is preferably attached to cap wafer 42 by a fusion bond, which can also be made hermetic. As a result, the entire assembly of reference wafer 44, gyroscope wafer 20 and cap wafer 42 can provide a hermetic barrier between gyroscope elements (such as masses 22 and 24) and an ambient environment.

In order to meet some performance specifications of different markets for the gyroscope, it is advantageous, in some cases, to provide a reduced pressure (e.g., about 1 mTorr, which is substantially less than atmospheric pressure) within the enclosure provided by the hermetic barrier. In this manner, resistance to motion of masses 22 and 24 due to air (or other gas) filling the enclosure is desirably reduced. Alternatively, holes can be provided in masses 22 and 24 (and in other moving parts of the linkage) to reduce air resistance to motion. In other cases, it may be desirable to provide a pressure within the hermetic enclosure that is greater than atmospheric pressure.

This discussion of FIGS. 7a–d, 8a–d, 9a–b, and 10a–b provides a schematic overview of an exemplary sequence of processing steps suitable for fabricating a preferred embodiment of the invention. Therefore, no single step discussed above is essential for practicing the invention. Furthermore, most of the steps discussed above can be performed using alternate methods not mentioned above, but which are well-known in the semiconductor processing art. More generally, the entire detailed description has generally been by way of example, as opposed to limitation. In the following, further examples of embodiments of the invention are briefly described.

Figure 12:
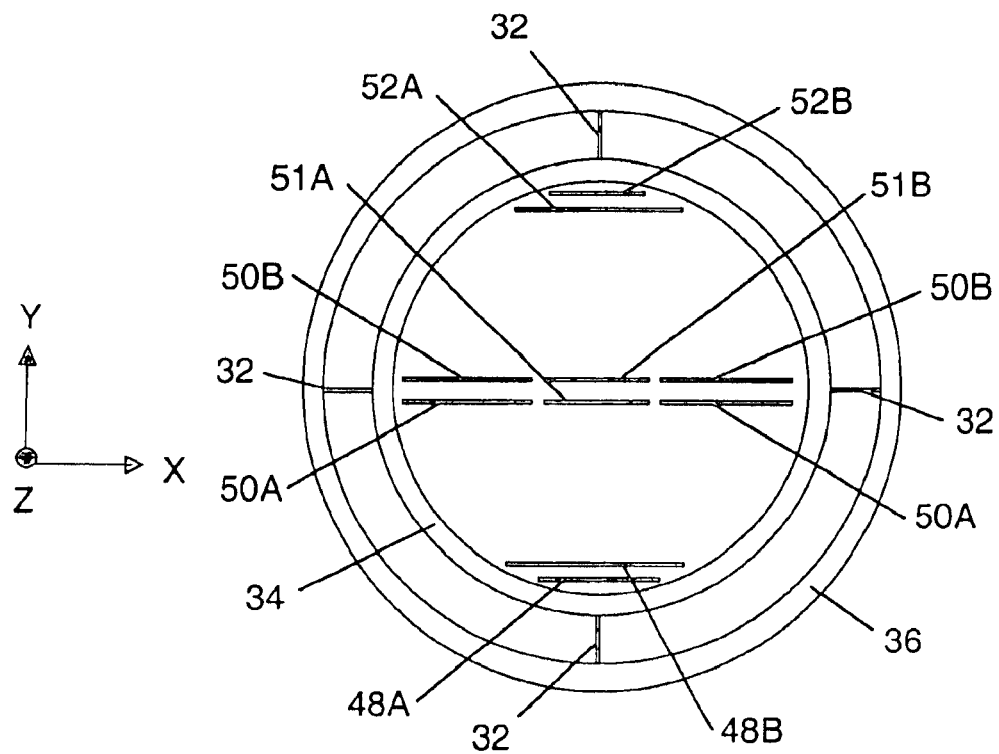
FIG. 12 schematically shows an arrangement of electrodes on a reference wafer according to an embodiment of the invention.

FIG. 12 is a schematic top view of an alternate electrode configuration. In the view of FIG. 12, masses 22 and 24, and plates 26, 28, and 30 are not shown, so that the electrodes beneath these elements of the linkage can be seen. In the configuration of FIG. 12, electrodes 48A, B, 50A, B and 52A, B serve to drive plates 30, 28, and 26 respectively, as described above. In addition, the configuration of FIG. 12 provides electrodes 51A and 51B for sensing motion of the masses, or more generally, motion of the linkage. Signals provided by electrodes 51A and 51B can be advantageously used by circuitry which drives the linkage actuators. For example, sensing the motion of the linkage in this manner allows the driving circuitry to drive the linkage precisely at its fundamental mechanical resonance frequency.

Figure 13:
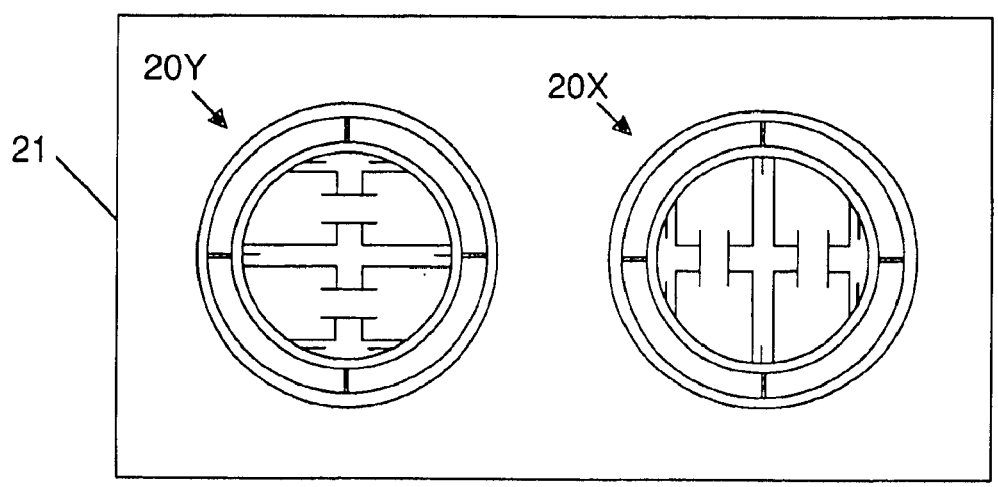
FIG. 13 schematically shows a dual-axis embodiment of the invention.

FIG. 13 schematically shows a top view of an integrated dual-axis gyroscope according to an embodiment of the present invention. In the configuration of FIG. 13, a Y-axis subsensor 20Y and an X-axis subsensor 20X are preferably fabricated on a single Silicon chip 21. Subsensors 20X and 20Y are preferably sensors as described in connection with FIGS. 1 and 2, and the configuration of FIG. 13 advantageously provides dual-axis sensing with an integrated angular velocity sensor. Such integration greatly reduces cost, compared to two non-integrated, single-axis sensors.

Figure 14A:
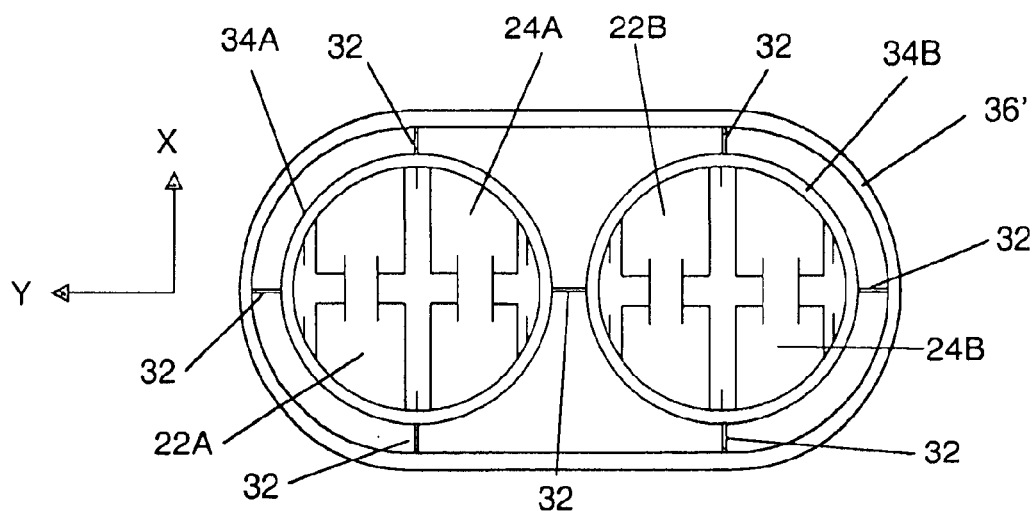
FIGS. 14a and 14b schematically show embodiments of the invention having four proof masses.
Figure 14B:
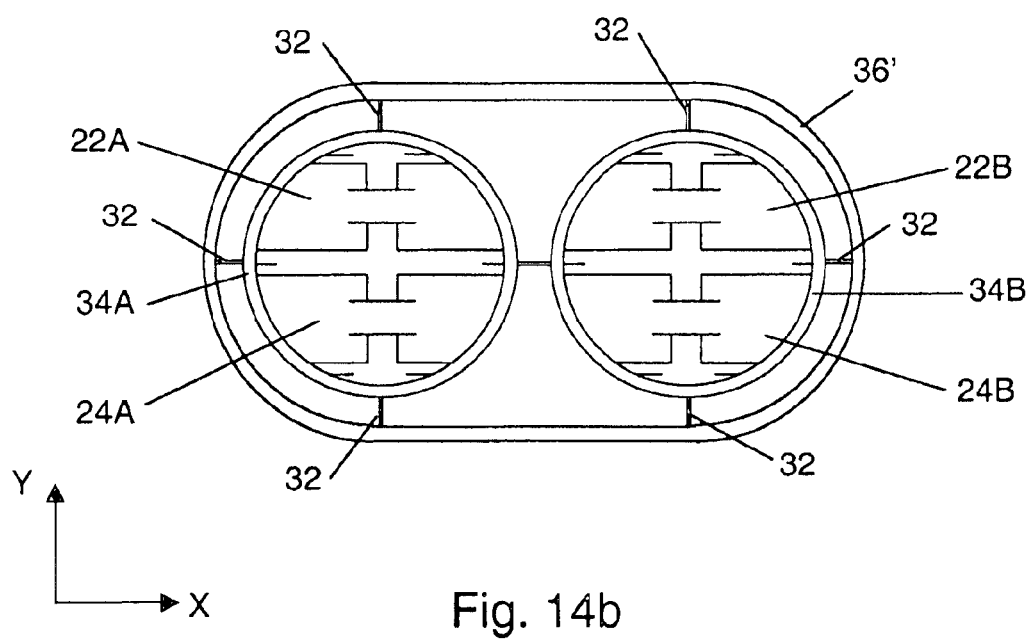

FIGS. 14a and 14b schematically show a top view of an embodiment of the invention that provides further common-mode rejection of unwanted motion. The configurations of FIGS. 14a and 14b include two frames, frame 34A and frame 34B. Masses 22A and 24A are positioned within frame 34A and masses 22B and 24B are positioned within frame 34B in much the same way that masses 22 and 24 are positioned within frame 34 on FIG. 1. Masses 22A, B and 24A, B on FIGS. 14a and 14b are driven into oscillation such that masses 24A and 22B are in phase. Masses 22A and 24A are linked to move out of phase, as are masses 22B and 24B.

Frames 34A and 34B are connected to each other by a flexure 32, and are connected to a base 36' by a plurality of flexures 32. The flexure configurations shown on FIGS. 14a and 14b are exemplary, and the invention can be practiced with other flexure configurations. The connection of frame 34A to frame 34B by flexure 32 tends to inhibit in-phase rotation of frames 34A and 34B relative to out-of-phase rotation of frames 34A and 34B because in-phase rotation of frames 34A and 34B stretches flexure 32 more than out-of-phase rotation of the same magnitude.

When the sensor of FIG. 14a is rotated about the Y axis on FIG. 14a (or the sensor of FIG. 14b is rotated about the Y axis on FIG. 14b), the Z directed torques imparted to frames 34A and 34B are out of phase. The reason for this is that the two linkages within frames 34A and 34B are moving out of phase with respect to each other. In contrast, angular acceleration of the sensors of FIGS. 14a and 14b about the Z axis causes frames 34A and 34B to rotate in phase. Thus, the sensors of FIGS. 14a and 14b can reject spurious signals due to angular acceleration about the Z axis, which is a capability the embodiment of FIG. 1 does not provide. Rotation of frames 34A and 34B on FIGS. 14a and 14b can be sensed as discussed above (e.g., with a capacitive sensor).

Furthermore, the embodiments of FIGS. 14a and 14b have zero net linear and angular momentum in the driven linkages, while the embodiment of FIG. 1 has zero net linear momentum but nonzero net angular momentum in the driven linkage. Since transfer of vibration to the sensor package tends to decrease when the driven linkage has zero net linear or angular momentum, the embodiments of FIGS. 14a and 14b should provide reduced package vibration compared to the embodiment of FIG. 1. Reduced vibration can result in reduced measurement errors, such as bias errors and quadrature errors.

In order to maximize the benefit of the common mode rejection of Z-directed angular acceleration provided by the embodiments of FIGS. 1a and 14b, it is preferable for frames 34A and 34B to have substantially the same shape, and for the linkages within frames 34A and 34B to have substantially the same configuration and orientation. This level of symmetry provides motions responsive to Y-directed angular velocity that are substantially equal and opposite, which maximizes the rejection of motions not responsive to Y-directed angular velocity (e.g., motions due to Z-directed angular acceleration).

Figure 15:
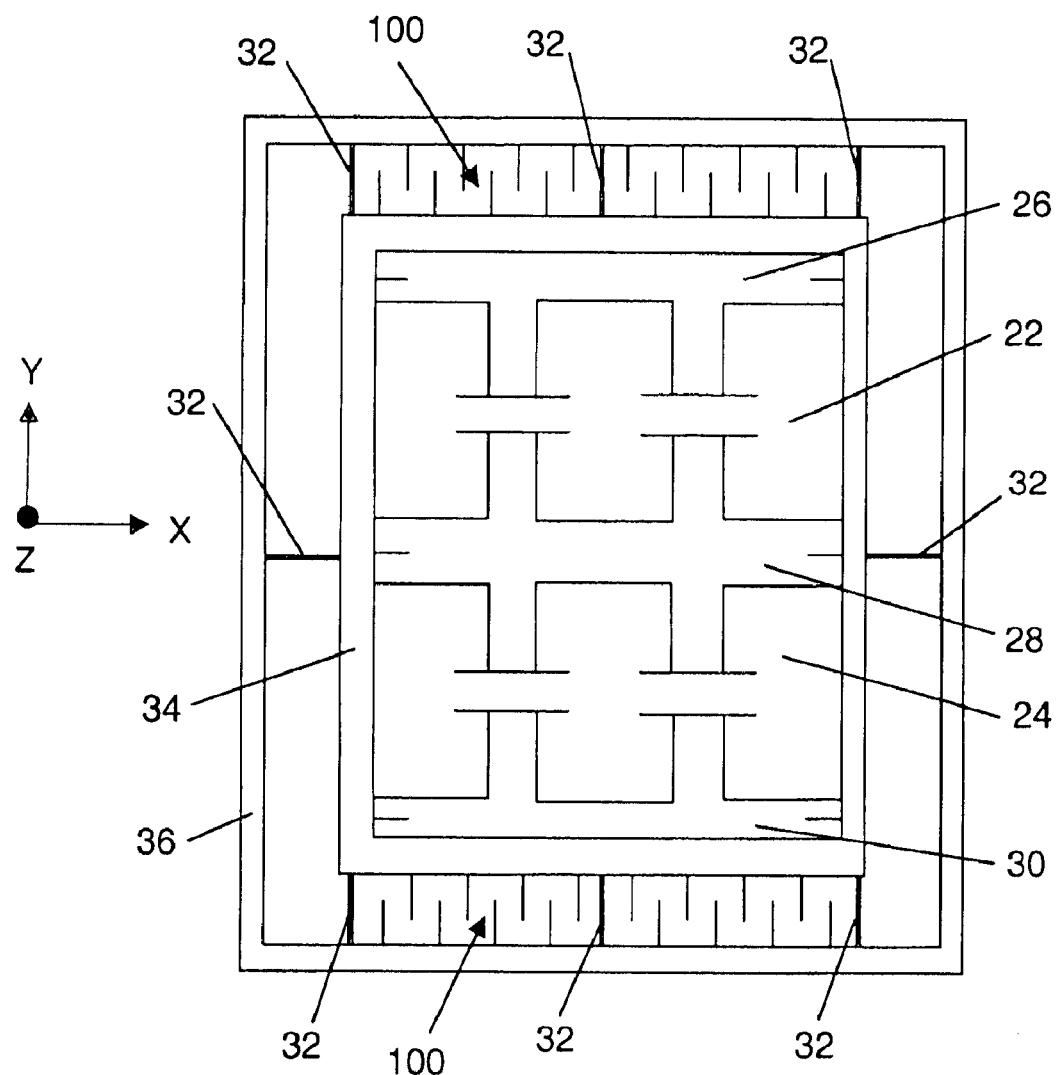
FIG. 15 schematically shows an embodiment of the invention having a rectangular frame.

FIG. 15 schematically shows an alternate embodiment of the invention, where frame 34 and base 36 are rectangular instead of circular. Within frame 34 on FIG. 15, masses 22 and 24 are linked together by plates 26, 28, and 30, similar to the embodiment of FIG. 1. Also as in the embodiment of FIG. 1, the linkage including masses 22 and 24, and plates 26, 28, and 30 is preferably driven into oscillation by electrostatic actuators (not shown on FIG. 15). Rotation of the embodiment of FIG. 15 about the Y axis will induce X-directed Coriolis forces on masses 22 and 24. Frame 34 is connected to base 36 with a plurality of flexures 32 which permit frame 34 to move relative to base 36. The X-directed Coriolis forces on masses 22 and 24 responsive to angular velocity of the sensor about the Y axis tend to cause frame 34 to move relative to base 36 in the X direction. Relative motion between frame 34 and base 36 is preferably sensed with capacitive sensors 100, schematically shown on FIG. 15.

The configuration of frame 34 and flexures 32 on FIG. 15 inhibits overall rotation of frame 34 and senses X directed deformation of frame 34 responsive to Y-directed angular velocity. An alternate configuration of frame 34 and flexures 32 on FIG. 15 can also be employed, which inhibits X-directed deformation (e.g., by making frame 34 stiffer), and senses rotation of frame 34.

Figure 16A:
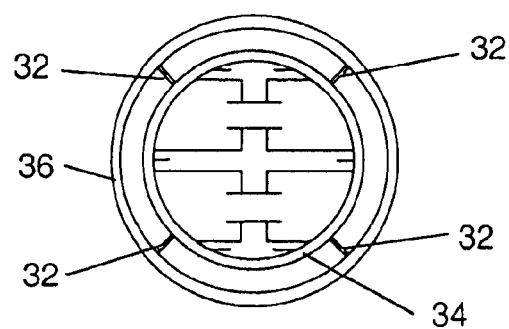
FIGS. 16a and 16b schematically show two other flexure configurations (in addition to the configuration of FIG. 1) which are also suitable for practicing the invention.
Figure 16B:
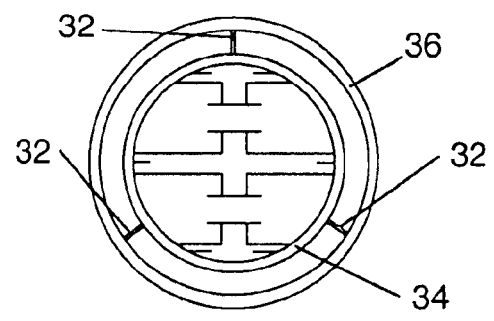

FIGS. 16a and 16b show examples of alternative configurations for flexures 32 between frame 34 and base 36. FIG. 16a shows an arrangement of flexures 32 that is rotated by 45 degrees relative to the arrangement of flexures 32 shown on FIG. 1. FIG. 16b shows an arrangement of three flexures 32 symmetrically disposed between frame 34 and base 36. Of course, the invention can be practiced with any arrangement of flexures between frame 34 and base 36 that permit frame 34 to move relative to base 36 responsive to the angular velocity to be sensed.

In the above detailed description of embodiments of the invention, an actuator for driving the linkage into oscillation being an electrostatic actuator was disclosed. Alternate actuators for driving the linkage into oscillation include but are not limited to, electromagnetic actuators, piezoelectric actuators and thermal actuators. Also in the above description, a transducer for sensing angular oscillation of frame 34 being a capacitive sensor was disclosed. Alternate transducers for sensing angular oscillation of frame 34 include but are not limited to, electromagnetic sensors, piezoresistive sensors, and piezoelectric sensors.

In the above detailed description of embodiments of the invention, an actuator for driving frame 34 into angular oscillation being an electrostatic actuator was disclosed. Alternate actuators for driving frame 34 into oscillation include but are not limited to, electromagnetic actuators, piezoelectric actuators and thermal actuators. Also in the above description, a transducer for sensing oscillation of the linkage being a capacitive sensor was disclosed. Alternate transducers for sensing oscillation of the linkage include but are not limited to, electromagnetic sensors, piezoresistive sensors, and piezoelectric sensors.

What is claimed is:

1. A sensor for measuring angular velocity in a sensor plane, the sensor comprising:
    a) a sensing subassembly comprising:
        i) a substantially planar frame parallel to said plane;
        ii) a first mass disposed in said plane;
        iii) a second mass disposed in said plane laterally to said first mass; and
        iv) a linkage within said frame and connected to said frame, wherein said linkage is connected to said first mass and to said second mass and wherein said linkage constrains said first and second masses to move in opposite directions perpendicular to said plane;
    b) an actuator for driving a first portion of said subassembly into oscillation at a drive frequency; and
    c) a transducer for sensing motion of a second portion of said subassembly responsive to said angular velocity.

2. The sensor of claim 1, wherein said actuator is selected from the group consisting of electrostatic actuators, electromagnetic actuators, piezoelectric actuators, and thermal actuators.

3. The sensor of claim 1, wherein said transducer is selected from the group consisting of capacitive sensors, electromagnetic sensors, piezoelectric sensors, and piezoresistive sensors.

4. The sensor of claim 1, wherein said first portion of said subassembly is said linkage and said second portion of said subassembly is said frame.

5. The sensor of claim 4, wherein said actuator comprises an electrostatic actuator connected to said linkage, and wherein said transducer comprises a capacitive sensor connected to said frame.

6. The sensor of claim 1, wherein said first portion of said subassembly is said frame and said second portion of said subassembly is said linkage.

7. The sensor of claim 6, wherein said actuator comprises an electrostatic actuator connected to said frame, and wherein said transducer comprises a capacitive sensor connected to said linkage.

8. The sensor of claim 1, wherein motion of said frame is substantially constrained to rotation about an axis perpendicular to said sensor plane.

9. The sensor of claim 8, wherein said frame is substantially circular.

10. The sensor of claim 1, wherein said frame is substantially rectangular.

11. The sensor of claim 1, wherein said first and second masses are constrained to move only substantially perpendicular to said sensor plane, relative to said frame.

12. The sensor of claim 1, further comprising a hole in at least one of said masses to reduce air resistance.

13. The sensor of claim 1, wherein said linkage further comprises:
 a center plate connected to said frame and connected to and in between said first and second masses, wherein said center plate is rotatable about a center axis of rotation;
 a first edge plate connected to said frame and to said first mass, wherein said first edge plate is rotatable about a first axis of rotation; and
 a second edge plate connected to said frame and to said second mass, wherein said second edge plate is rotatable about a second axis of rotation;
 wherein said center, first and second axes of rotation are parallel to each other and are also parallel to said sensor plane.

14. The sensor of claim 13, wherein said center plate further comprises a first lever arm connected to said first mass and a second lever arm connected to said second mass, whereby motion of said masses perpendicular to said sensor plane responsive to rotation of said center plate is increased.

15. The sensor of claim 13, wherein said first edge plate further comprises a lever arm connected to said first mass, whereby motion of said first mass perpendicular to said sensor plane responsive to rotation of said first edge plate is increased.

16. The sensor of claim 13, wherein said second edge plate further comprises a lever arm connected to said second mass, whereby motion of said second mass perpendicular to said sensor plane responsive to rotation of said second edge plate is increased.

17. The sensor of claim 1, wherein said frame has a fundamental frame resonant mode having angular rotation of said frame about an axis perpendicular to said sensor plane.

18. The sensor of claim 1, wherein said linkage has a fundamental linkage resonant mode having oscillation of said first and second masses, substantially 180 degrees out of phase with respect to each other, in a direction perpendicular to said sensor plane.

19. The sensor of claim 18, wherein said frame has a fundamental frame resonant mode having angular rotation of said frame about an axis perpendicular to said sensor plane.

20. The sensor of claim 19, wherein said frame resonant mode has a higher frequency than a frequency of said linkage resonant mode.

21. The sensor of claim 18, wherein a frequency of said linkage resonant mode is about equal to said drive frequency.

22. The sensor of claim 1, further comprising a substantially planar base parallel to and positioned around said frame.

23. The sensor of claim 22, further comprising a plurality of flexures connecting said base to said frame such that said frame is rotatable about an axis perpendicular to said sensor plane.

24. The sensor of claim 23, further comprising a tab extending from said base which is engaged in a groove within said frame, the combination of said tab and said groove restricting the range of motion of said frame, thereby protecting said flexures.

25. The sensor of claim 22, further comprising a Silicon reference wafer having a top surface attached to said base, wherein said sensing subassembly and said base are etched from a single Silicon gyroscope wafer.

26. The sensor of claim 25 wherein said reference wafer comprises two recesses to accommodate motion of said first and second masses perpendicular to said sensor plane.

27. The sensor of claim 25, wherein said reference wafer comprises CMOS electronics electrically connected to said sensing subassembly.

28. The sensor of claim 25, further comprising a capacitive sensor for sensing motion of said linkage relative to said reference wafer.

29. The sensor of claim 28, wherein said linkage further comprises:
 a center plate connected to said frame and connected to and in between said first and second masses, wherein said center plate is rotatable about a center axis of rotation;
 a first edge plate connected to said frame and to said first mass, wherein said first edge plate is rotatable about a first axis of rotation; and
 a second edge plate connected to said frame and to said second mass, wherein said second edge plate is rotatable about a second axis of rotation;
 wherein said center, first and second axes of rotation are parallel to each other and are also parallel to said sensor plane.

30. The sensor of claim 29, wherein said actuator comprises:
 a first edge split electrode positioned beneath said first edge plate on said top surface of said reference wafer and separated from said first edge plate by a predetermined distance d;
 a second edge split electrode positioned beneath said second edge plate on said top surface of said reference wafer and separated from said second edge plate by the distance d;
 a center split electrode positioned beneath said center plate on said top surface of said reference wafer and separated from said center plate by the distance d.

31. The sensor of claim 30, wherein said first edge electrode, said second edge electrode and said center split electrode are electrically driven in a cooperative manner to excite an oscillation mode of said linkage having oscillation of said first and second masses, substantially 180 degrees out of phase with respect to each other, in a direction perpendicular to said sensor plane.

32. The sensor of claim 31, wherein said drive frequency is substantially equal to a resonant frequency of said oscillation mode.

33. The sensor of claim 30, wherein said transducer comprises a capacitive sensor connected to said base and to said frame, and wherein said reference wafer comprises CMOS electronics connected to said capacitive sensor and connected to said first edge electrode, said second edge electrode and said center split electrode, whereby wafer scale integration of said actuator and said transducer is obtained.

34. The sensor of claim 25 further comprising a plurality of flexures connecting said frame to said reference wafer such that said frame is rotatable about an axis perpendicular to said sensor plane, said flexures passing through said base and separated from said base by a plurality of base isolation trenches, whereby stress in said base is not coupled to said flexures.

35. The sensor of claim 34, further comprising a plurality of reference isolation trenches separating said top surface of said reference wafer from said flexures, whereby surface stress in said top surface of said reference wafer is substantially not coupled to said flexures.

36. The sensor of claim 25, further comprising a Silicon cap wafer having a bottom surface attached to said base.

37. The sensor of claim 36, wherein said cap wafer comprises a recess to accommodate motion of said first and second masses perpendicular to said sensor plane.

38. The sensor of claim 36, wherein said cap wafer is hermetically attached to said base, and said reference wafer is hermetically attached to said base.

39. The sensor of claim 38, wherein a gas pressure within a hermetic enclosure formed by said base, said cap wafer and said reference wafer is substantially different from atmospheric pressure.

40. The sensor of claim 38, wherein said cap wafer is hermetically attached to said base with a Si to $SiO_2$ fusion bond, and said reference wafer is hermetically attached to said base with a metal seal.

41. The sensor of claim 36, further comprising a plurality of flexures connecting said frame to said cap wafer such that said frame is rotatable about an axis perpendicular to said sensor plane, said flexures passing through said base and separated from said base by a plurality of base isolation trenches, whereby stress in said base is not coupled to said flexures.

42. The sensor of claim 41, further comprising a plurality of cap isolation trenches separating said bottom surface of said cap wafer from said flexures, whereby surface stress in said bottom surface of said cap wafer is substantially not coupled to said flexures.

43. The sensor of claim 42, wherein said flexures are connected to said reference wafer.

44. The sensor of claim 43, further comprising a plurality of reference isolation trenches separating said top surface of said reference wafer from said flexures, whereby surface stress in said top surface of said reference wafer is substantially not coupled to said flexures.

45. A dual-axis sensor for measuring X and Y components of angular velocity in an X-Y sensor plane, the dual-axis sensor comprising:
A) a first subsensor for measuring the X component of angular velocity, the first subsensor comprising:
  a) a first sensing subassembly comprising:
    i) a substantially planar first frame parallel to said plane;
    ii) a first mass disposed in said plane;
    iii) a second mass disposed in said plane laterally to said first mass; and
    iv) a first linkage within said frame and connected to said frame, wherein said linkage is connected to said first mass and to said second mass and wherein said first linkage constrains said first and second masses to move in opposite directions perpendicular to said plane;
  b) a first actuator for driving a first portion of said first subassembly into oscillation at a drive frequency; and
  c) a first transducer for sensing motion of a second portion of said first subassembly responsive to the X component of angular velocity; and B) a second subsensor for measuring the Y component of angular velocity, the second subsensor comprising:
  a) a second sensing subassembly comprising:
    i) a substantially planar second frame parallel to said plane;
    ii) a third mass disposed in said plane;
    iii) a fourth mass disposed in said plane laterally to said third mass; and
    iv) a second linkage within said second frame and connected to said second frame, wherein said linkage is connected to said third mass and to said fourth mass and wherein said second linkage constrains said third and fourth masses to move in opposite directions perpendicular to said plane;
  b) a second actuator for driving a first portion of said second subassembly into oscillation at a drive frequency; and
  c) a second transducer for sensing motion of a second portion of said second subassembly responsive to the Y component of angular velocity.

46. A sensor for measuring angular velocity in a sensor plane, the sensor comprising:
a) a first sensing subassembly comprising:
  i) a substantially planar first frame parallel to said plane;
  ii) a first mass disposed in said plane;
  iii) a second mass disposed in said plane laterally to said first mass; and
  iv) a first linkage within said frame and connected to said frame, wherein said linkage is connected to said first mass and to said second mass and wherein said first linkage constrains said first and second masses to move in opposite directions perpendicular to said plane;
b) a first actuator for driving a first portion of said first subassembly into oscillation at a drive frequency;
c) a first transducer for sensing a first motion of a second portion of said first subassembly responsive to said angular velocity;
d) a second sensing subassembly comprising:
  i) a substantially planar second frame parallel to said plane;
  ii) a third mass disposed in said plane;
  iii) a fourth mass disposed in said plane laterally to said third mass; and
  iv) a second linkage within said second frame and connected to said second frame, wherein said linkage is connected to said third mass and to said fourth mass and wherein said second linkage constrains said third and fourth masses to move in opposite directions perpendicular to said plane, wherein said second linkage has substantially the same configuration and orientation as said first linkage, said third mass corresponding to said first mass and said fourth mass corresponding to said second mass;
e) a second actuator for driving a first portion of said second subassembly into oscillation at a drive frequency; and
f) a second transducer for sensing a second motion of a second portion of said second subassembly responsive to said angular velocity;
wherein signals from said first and second transducers are combined to distinguish said first and second motions responsive to said angular velocity from a motion not responsive to said angular velocity.

47. The sensor of claim 46, wherein said first portion of said first subassembly is said first linkage, and wherein said second portion of said first subassembly is said first frame, and wherein said first portion of said second subassembly is said second linkage, and wherein said second portion of said second subassembly is said second frame.

48. The sensor of claim 47, wherein said first and second linkages are driven such that said first mass and said third mass are driven to move in opposite directions perpendicular to said plane.

49. The sensor of claim 48, wherein said first and second frames are rotatable within said plane, and further comprising a frame linkage connecting said first frame to said second frame, wherein said first and second frames are constrained to rotate in opposite directions by said frame linkage.

* * * * *